(12) United States Patent
Dichler et al.

(10) Patent No.: US 11,769,995 B2
(45) Date of Patent: Sep. 26, 2023

(54) ARC FAULT DETECTION DEVICE

(71) Applicant: Eaton Intelligent Power Limited, Dublin (IE)

(72) Inventors: Werner Dichler, Grossschoenau (AT); Krzysztof Kowalów, Vienna (AT)

(73) Assignee: EATON INTELLIGENT POWER LIMITED, Dublin (IE)

(*) Notice: Subject to any disclaimer, the term of this patent is extended or adjusted under 35 U.S.C. 154(b) by 0 days.

(21) Appl. No.: 17/378,835

(22) Filed: Jul. 19, 2021

(65) Prior Publication Data
US 2022/0029406 A1   Jan. 27, 2022

(30) Foreign Application Priority Data
Jul. 21, 2020  (GB) ...................... 2011232

(51) Int. Cl.
*H02H 1/00* (2006.01)
*G01R 31/52* (2020.01)
*G01R 31/08* (2020.01)

(52) U.S. Cl.
CPC ......... *H02H 1/0015* (2013.01); *G01R 31/085* (2013.01); *G01R 31/52* (2020.01)

(58) Field of Classification Search
CPC .... H02H 1/0015; G01R 31/085; G01R 31/52; G01R 31/14; G01R 31/1272
See application file for complete search history.

(56) References Cited

U.S. PATENT DOCUMENTS

| 10,401,410 | B2* | 9/2019 | Misumi | G01R 31/1272 |
| 2007/0121261 | A1* | 5/2007 | Sung | H02H 1/0015 361/42 |
| 2008/0204950 | A1* | 8/2008 | Zhou | H02H 1/0015 361/42 |

(Continued)

FOREIGN PATENT DOCUMENTS

| CN | 107561416 A | 1/2018 |
| JP | 2018179723 A | 11/2018 |

OTHER PUBLICATIONS

Fenz et al "Detection of arc faults in PV systems using Compressed Sensing", IEEE Journal of Photovoltaics, vol. 10, No. 2, Mar. 2020 (Year: 2020).*

(Continued)

*Primary Examiner* — Giovanni Astacio-Oquendo
*Assistant Examiner* — Dilara Sultana
(74) *Attorney, Agent, or Firm* — LEYDIG, VOIT & MAYER

(57) ABSTRACT

An arc fault detection device includes: a first electric line; at least one sensor for monitoring an electric current or voltage spectrum in the first electric line and outputting an analogue HF measurement signal; and an input section connected to the at least one sensor, the input section including: an input bandpass filter connected to the at least one sensor so as to filter the analogue HF measurement signal, a passband of the input bandpass filter having a predeterminable arc-frequency range so as to detect arcing effects; and a sampling mixer connected to the input bandpass filter, the sampling mixer having a sampling frequency lower than twice an upper threshold frequency of the arc-frequency range.

16 Claims, 2 Drawing Sheets

(56) References Cited

U.S. PATENT DOCUMENTS

| | | | | |
|---|---|---|---|---|
| 2009/0065696 A1* | 3/2009 | Mann | ............... | H04B 1/40 |
| | | | | 250/339.02 |
| 2013/0194022 A1* | 8/2013 | Sander | ............ | H03D 7/125 |
| | | | | 327/356 |
| 2019/0339319 A1 | 11/2019 | Jakupi | | |
| 2019/0363530 A1* | 11/2019 | Jakupi | ............ | H02H 1/0015 |

OTHER PUBLICATIONS

Mishali et al. "From Theory to Practice: Sub-Nyquist Sampling of Sparse Wideband Analog Signals", IEEE Journal of Selected Topics in Signal Processing, vol. 4, No. 2, Apr. 2010 (Year: 2010).*

Vaughan et al. "The Theory of Bandpass Sampling", IEEE Transactions On Signal Processing. vol. 39. No. 9. Sep. 1991 (Year: 1991).*

Fenz, et al., "Detection of Arc Faults in PV Systems Using Compressed Sensing," *IEEE Journal of Photovoltaics*, Mar. 2020, pp. 676-684, 10-3, Institute of Electrical and Electronics Engineers, New York, USA.

* cited by examiner

ARC FAULT DETECTION DEVICE

CROSS-REFERENCE TO PRIOR APPLICATION

Priority is claimed to British Patent Application No. GB 2011232.2, filed on Jul. 21, 2020, the entire disclosure of which is hereby incorporated by reference herein.

FIELD

The present disclosure relates to an arc fault detection device.

BACKGROUND

Arc fault detection devices are known according a lot of different detection methods.

Electric arcs cause high frequency noise on an electric line or in an electric circuit. Arc fault detectors observe electric lines by measuring the electric current or voltage and analyzing the measurement signals. Known arc fault detectors detect an arc by analyzing the frequency behavior of the electric current or voltage regarding specific patterns in high frequency components of the measurement signal.

Even if it analyzing signals in the interesting high or radio frequency range might be easy within a radio measurement laboratory the required equipment is bulky and cost extensive. It is not possible to implement these technics respective measurement equipment in a commercial arc fault detection device (AFDD) which can be sold at a reasonable price and which is small enough to be arranged in a typical household and/or commercial fuse box.

It is known to mix the RF frequency measurement signal to a lower frequency range. Even if analyzing a signal with a lower frequency would be easier, the down-mixing typically costs signal level and requires an addition amplification circuit.

Combining a low complexity, a small and simple hardware design and low costs together with a low tendency for nuisance tripping is one of the mayor problems of all arc fault detection devices.

SUMMARY

In an embodiment, the present invention provides an arc fault detection device, comprising: a first electric line; at least one sensor configured to monitor an electric current or voltage spectrum in the first electric line and to output an analogue HF measurement signal; and an input section connected to the at least one sensor, the input section comprising: an input bandpass filter connected to the at least one sensor so as to filter the analogue HF measurement signal, a passband of the input bandpass filter comprising a predeterminable arc-frequency range so as to detect arcing effects; and a sampling mixer connected to the input bandpass filter, the sampling mixer having a sampling frequency lower than twice an upper threshold frequency of the arc-frequency range.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention provides an arc fault detection device with a small and simple hardware design which is easy to implement and with a low tendency for nuisance tripping.

The arc fault detection device can be implemented using small and simple hardware. The sampling mixer could be realized with just two passive components, a semiconductor switch and a very simple signal generator. Therefore a very simple and small PCB design is possible.

The sampling mixer consciously violates the Nyquist-Shannon criterion. The thereby caused aliasing effect creates further signals with low frequency and increases the signal level in the mixed down frequency band. Therefore no further amplification stage is necessary. Because of the high signal level in an easy to analyse frequency band the AFDD has a low tendency for nuisance tripping.

Figure 1:
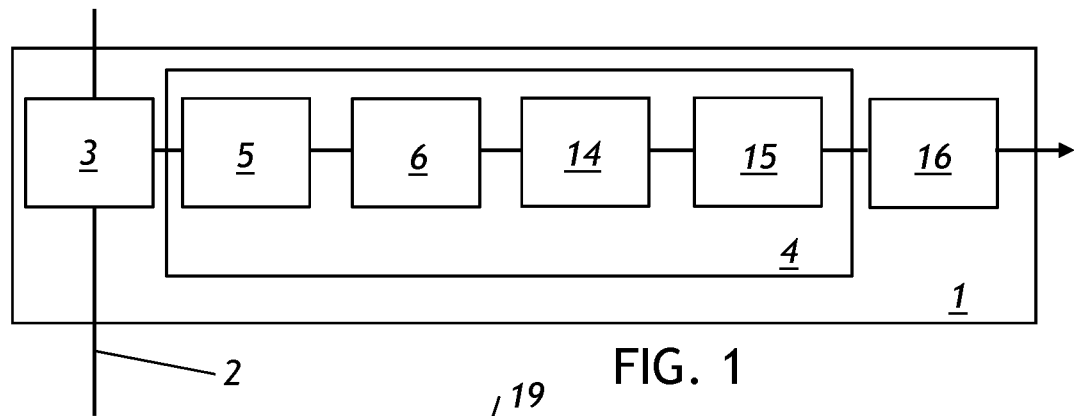
FIG. 1 a block diagram of a preferred embodiment of an actual arc fault detection device.

FIG. 1 shows a preferred embodiment of an arc fault detection device 1 with a first electric line 2 and at least one sensor 3 adapted for monitoring an electric current or voltage spectrum in the first electric line 2 and outputting an analogue HF measurement signal, the arc fault detector 1 further comprises an input section 4 connected to the sensor 3, the input section 4 comprises:

an input bandpass filter 5 connected to the sensor 3 for filtering the analogue HF measurement signal, with a passband 18 of the input bandpass filter 5 comprises a predeterminable arc-frequency range 7 for detecting arcing effects, a sampling mixer 6 connected to the input bandpass filter 5, with a sampling frequency 10 of the sampling mixer 6 is lower than twice an upper threshold frequency 9 of the arc-frequency range 7.

A common short cut for arc fault detection device 1 is AFDD 1. This short cut is also used in this text.

The arc fault detection device 1 can be implemented using small and simple hardware. The sampling mixer 6 could be realized with just two passive components 22, 23, a semiconductor switch 24 and a very simple signal generator 13. Therefore a very simple and small PCB design is possible.

The sampling mixer 6 consciously violates the Nyquist-Shannon criterion. The thereby caused aliasing effects creates further signals with low frequency and increases the signal level in the mixed down frequency band. Therefore no further amplification stage is necessary. Because of the high signal level in an easy to analyse frequency band the AFDD 1 has a low tendency for nuisance tripping.

The AFDD 1 comprises at least one first electric line 2, which passes the AFDD 1. The AFDD 1 may comprise further electric lines. The AFDD 1 may be a standalone device or it may be integrated into an arc fault circuit breaker comprising switching contacts or a hybrid circuit arrangement or a solid state arrangement for interrupting the at least one electric line 2.

The AFDD 1 comprises at least one sensor 3 for monitoring an electric current or voltage spectrum in the first electric line 2. The sensor 3 may be of any type of sensor suitable for monitoring an electric voltage and/or current in a high frequency range. The sensor 3 is adapted for outputting an analogue HF measurement signal. Typical current or voltage sensors 3 usually output an analogue signal. HF means high frequency. Another shortcut for HF is RF for radio frequency. In the context of this invention HF or RF means a signal in the range of a few MHz.

Arcs generate frequency components in typical frequency ranges. An arc could be determined by analyzing only a part of a spectrum. This part or bandwidth is named arc-frequency range 7. As arcs typically generate signals with some bandwidth, different signal bands may be used as arc-frequency range 7. According the actual invention it is intended to determine a frequency range as arc-frequency range 7 in advance. According the preferred embodiment the arc-frequency range 7 has a lower threshold frequency 8 in the range from 2 MHz to 4 MHz. According the preferred embodiment the arc-frequency range 7 has an upper threshold frequency 9 in the range from 4 MHz to 6 MHz. It is further preferred that the arc-frequency range 7 has a bandwidth of at least 500 kHz. Research has shown that arcs could be detected with high accuracy by analysing this frequency range.

The AFDD 1 further comprises an input section 4 connected to the sensor 3. The input section 4 is intended for editing the measurement signal provided by the sensor 3 before it would be analysed in a control unit 16 connected to the input section 4.

Figure 4:
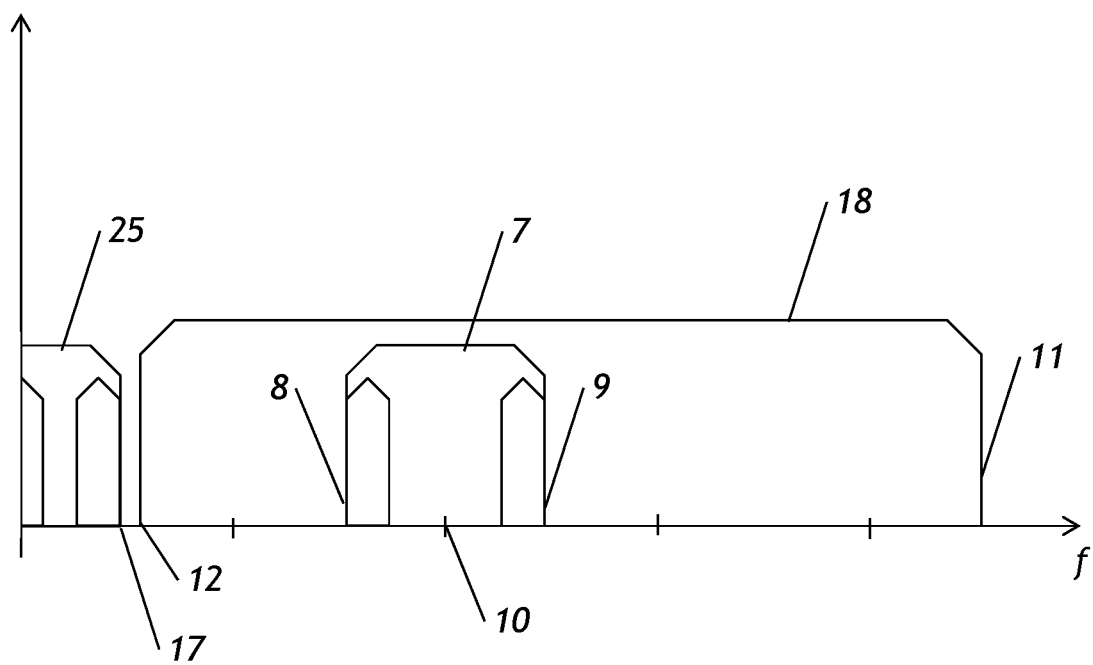
FIG. 4 a frequency spectrum.

The input section 4 comprises an input bandpass filter 5 connected to the sensor 3 for filtering the analogue HF measurement signal. The passband 18 of the input bandpass filter 5 has to be chosen in a way that the predetermined arc-frequency range 7 of interest for detecting arcing effects is part of the passband 18. FIG. 4 shows a frequency spectrum comprising the passband 18 of the input bandpass filter 5, with an upper cutoff frequency 11 and a lower cutoff frequency 12. The spectrum also shows the arc-frequency range 7.

Figure 2:
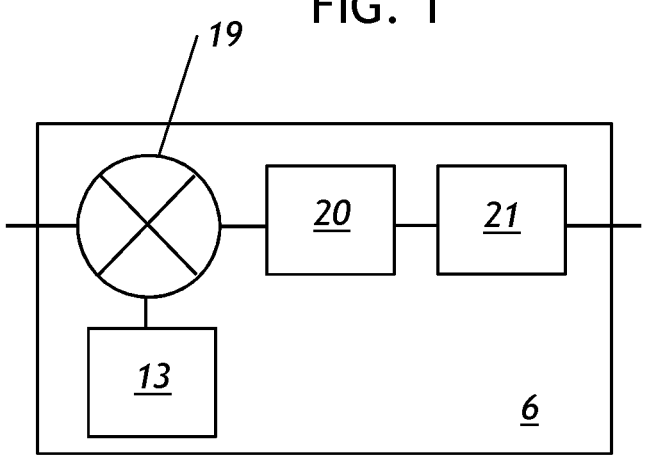
FIG. 2 a functional block diagram of a sampling mixer of the arc fault detection device according FIG. 1.

An output of the input bandpass filter 5 is connected to a sampling mixer 6 of the AFDD 1. The sampling mixer 6 transforms the bandpass filtered measurement signal to a lower frequency band, by mixing the measurement signal with a mixing signal with a sampling frequency 10. FIG. 2 shows a block diagram of a preferred embodiment of a sampling mixer 6. The sampling mixer 6 comprises a local oscillator 13 for generating the mixing signal with the sampling frequency 10. According the preferred embodiment the mixing signal is a rectangular signal. Rectangular signals can be generated with very simple generators, only comprising two semiconductor switches and a few passive components. The sampling frequency 10 is the fundamental of the rectangular signal. However the rectangular signal comprises higher harmonics.

It is intended that the sampling frequency 10 of the sampling mixer 6 is lower than twice an upper threshold frequency 9 of the arc-frequency range 7. This means that the Nyquist-Shannon criterion is violated and aliasing will happen during the mixing. As mentioned before the aliasing generates additional frequency components in the same frequency band as the measurement signal is transformed to. These additional frequency components are added to the components generated without aliasing.

The sampling frequency 10 is dependent to the frequency range 7 seen as relevant for arc detection. The preferred frequency ranges are described above. According a special embodiment the upper cutoff frequency 11 of the input bandpass filter 5 is higher than the upper threshold frequency 9 of the arc-frequency range 7, and that the sampling frequency 10 of the sampling mixer 6 is lower than twice the upper cutoff frequency 11 of the bandpass filter 5.

According an especially preferred embodiment the sampling frequency 10 is at least 1 MHz. This enables the ADFF to identify relevant signal changes within 1 μs.

Preferably the sampling frequency 10 is in the range of the most interesting frequency of the arc-frequency range 7. Because of the mixing effect of the sampling mixer 6 frequencies around the sampling frequency 10 are mixed down to a baseband signal. A 5.001 MHz signal mixed with a 5 MHz square wave gets transformed to 1 kHz and some additional mixing products. Because of the aliasing effect, caused by the sampling, the alias frequencies get transformed back to 1 kHz (4.999 MHz, 5.001 MHz, 9.999 MHz, 10.001 MHz, 14.999 MHz, . . . ). Some mixing products are located at these aliasing frequencies. This means that these signals are transformed to the 1 kHz base frequency.

As the arc-frequency range 7 is transferred to a baseband, it is preferred that a lower cutoff frequency 12 of the input bandpass filter 5 is higher than half a bandwidth of the arc-frequency range 7.

Figure 3:
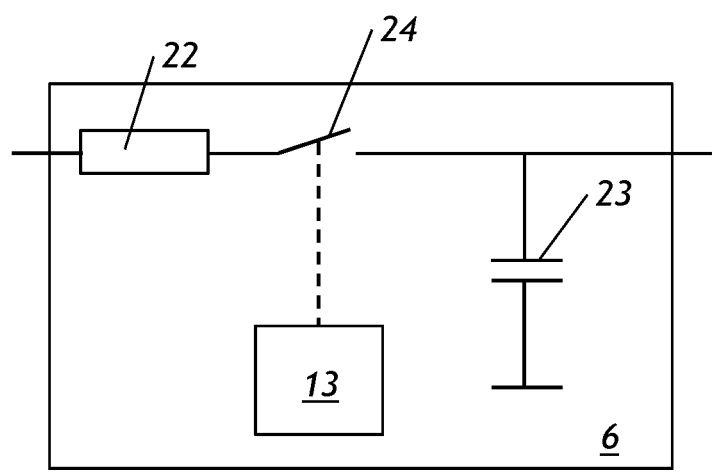
FIG. 3 a circuit diagram of a preferred embodiment of the sampling mixer according FIG. 2.

FIG. 3 shows an electric circuit diagram of a preferred embodiment of the sampling mixer 6. This embodiment comprises an ohmic resistance 22, a switching element 24, especially a semiconductor like a FET, and a capacitor 23. This embodiment of a sampling mixer 6 is a switchable, passive RC low pass, with a local oscillator 13 for controlling the switching element 24. It combines all three blocks according FIG. 2.

The duty cycle of the rectangular signal would control the effective value of the resistance 22. The value of the resistance influences the upper threshold frequency of the sampling mixer 6. Using 50% duty cycle will double the resistance. The resistance multiplication factor is equal with the inverse duty cycle. This kind of mixer is also called switched RC filter. According a preferred embodiment the duty cycle of the rectangular signal is controllable in a range from 20% to 80%, especially 50%. By increasing the duty cycle the amplitudes within the base frequency band could be increased. However, this introduces important disadvantages of different harmonic filtering.

An output of the sampling mixer 6 is connected to an intermediate bandpass filer 14 for removing unnecessary frequency components. According the preferred embodiment an upper cutoff frequency 17 of the intermediate bandpass filter 14 is lower than a lower cutoff frequency 12 of the input bandpass filter 5.

An envelope detector 15 is connected to an output of the intermediate filter 14. The envelope detector should be configured to detect signal changes within 10 μs. An envelope detector 15 is a standard component in a lot of AFDD.

An output of the envelope detector 15 is connected to a control unit 16 of the arc fault detection device 1. The control unit 16 is embodied for comparing the signal delivered by the envelop detector 15 with at least one arc criterion, and outputting a trigger signal if the signal matches the arc criterion.

The following are principles for understanding and interpreting the actual disclosure.

Features are usually introduced with an indefinite article "one, a, an". Unless otherwise stated in the context, therefore, "one, a, an" is not to be understood as a number word.

The binding word "or" is to be interpreted as inclusive and not as exclusive. Unless the context dictates otherwise, "A or B" also includes "A and B", where "A" and "B" represent any features.

By means of an ordering number word, for example "first", "second" or "third", in particular a feature X or an object Y are distinguished in several embodiments, unless otherwise defined by the disclosure of the invention. In particular, a feature X or object Y with an ordering number word in a claim does not mean that an embodiment of the invention covered by this claim must have a further feature X or another object Y.

An "essentially" in conjunction with a numerical value includes a tolerance of ±10% around the given numerical value, unless the context dictates otherwise.

For ranges of values, the endpoints are included, unless the context dictates otherwise.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An arc fault detection device, comprising:
   a first electric line;
   at least one sensor configured to monitor an electric current or voltage spectrum in the first electric line and to output an analogue HF measurement signal; and
   an input section connected to the at least one sensor, the input section comprising:
   an input bandpass filter connected to the at least one sensor so as to filter the analogue HF measurement signal, a passband of the input bandpass filter comprising a predeterminable arc-frequency range so as to detect arcing effects; and
   a sampling mixer connected to the input bandpass filter, the sampling mixer being configured to sample an output signal of the input bandpass filter with a sampling frequency lower than twice an upper threshold frequency of the arc-frequency range,
   wherein the sampling mixer consists essentially of a resistor, a capacitor, a semiconductor switch, and a signal generator.

2. The arc fault detection device of claim 1, wherein an upper cutoff frequency of the input bandpass filter is higher than an upper threshold frequency of the arc-frequency range, and
   wherein the sampling frequency of the sampling mixer is lower than twice the upper cutoff frequency of the bandpass filter.

3. The arc fault detection device of claim 1, wherein the sampling mixer comprises a local oscillator configured to generate a mixing signal with the sampling frequency, and
   wherein the mixing signal generated by the local oscillator is a rectangular signal.

4. The arc fault detection device of claim 3, wherein a duty cycle of the rectangular signal is controllable in a range from 20% to 80%.

5. The arc fault detection device of claim 1, wherein the arc-frequency range has a lower threshold frequency in a range from 2 MHz to 4 MHz.

6. The arc fault detection device of claim 1, wherein the arc-frequency range has an upper threshold frequency in a range from 4 MHz to 6 MHz.

7. The arc fault detection device of claim 1, wherein the sampling frequency is at least 1 MHz.

8. The arc fault detection device of claim 1, wherein a lower cutoff frequency of the input bandpass filter is higher than half a bandwidth of the arc-frequency range.

9. The arc fault detection device of claim 1, further comprising:
   an intermediate bandpass filter connected to an output of the sampling mixer.

10. The arc fault detection device of claim 9, wherein an upper cutoff frequency of the intermediate bandpass filter is lower than a lower cutoff frequency of the input bandpass filter.

11. The arc fault detection device of claim 9, further comprising:
    an envelope detector connected to an output of the intermediate bandpass filter.

12. The arc fault detection device of claim 11, wherein an output of the envelope detector is connected to a control unit of the arc fault detection device, and
    wherein the control unit is configured to compare a signal delivered by the envelop detector with at least one arc criterion and to output a trigger signal if the signal delivered by the envelop detector matches the at least one arc criterion.

13. The arc fault detection device of claim 4, wherein the duty cycle of the rectangular signal is controllable at 50%.

14. The arc fault detection device of claim 1, wherein the sampling mixer is configured to cause aliasing in sampling the output of the input bandpass filter.

15. The arc fault detection device of claim 1, wherein the semiconductor switch is a field effective transistor (FET).

16. The arc fault detection device of claim 1
    wherein the signal generator is an oscillator,
    wherein an input terminal of the signal generator is connected to the input bandpass filter,
    wherein the input terminal is in series connection with the resistor and an input of the semiconductor switch,
    wherein an output of the semiconductor switch is connected to an output terminal of the sampling mixer, wherein a first terminal of a capacitor is connected to the output of the semiconductor switch, and wherein the oscillator is configured to control the semiconductor switch.

* * * * *